United States Patent
Kriedt et al.

[11] 3,965,435
[45] June 22, 1976

[54] CIRCUIT FOR DEMODULATING AN AMPLITUDE MODULATED SIGNAL

[75] Inventors: Hans Kriedt, Munich; Eckart Shatter, Zorneding; Jean-Marc Zulauf, Munich, all of Germany

[73] Assignee: Siemens Aktiengesellschaft, Berlin & Munich, Germany

[22] Filed: Apr. 21, 1975

[21] Appl. No.: 570,182

[30] Foreign Application Priority Data
May 9, 1974 Germany.............................. 2422534

[52] U.S. Cl................................ 329/101; 329/163; 329/164; 329/169; 330/30 D
[51] Int. Cl.²......................................... H03D 1/18
[58] Field of Search ........... 329/101, 163, 164, 168, 329/169; 330/30 D

[56] References Cited
UNITED STATES PATENTS
3,673,505   6/1972   Limberg.............................. 329/101

OTHER PUBLICATIONS
IBM Tech. Bull., vol. 16, No. 7, Dec. 1973, "Base-to-Peak Amplitude Detector," C. R. Nielsen.

*Primary Examiner*—John Kominski
*Attorney, Agent, or Firm*—Hill, Gross, Simpson, Van Santen, Steadman, Chiara & Simpson

[57] ABSTRACT

A common emitter differential amplifier is arranged to receive an amplitude modulated high frequency signal and demodulate it. The common emitter differential amplifier has the emitters of two transistors connected together and these emitters are then connected through a constant current source to a reference potential. At least one of the collectors of the two transistors is connected through a collector resistor to a potential source. The collector of the other transistor is connected to the same potential source either directly or through a resistor associated with it. Negative feedback is provided through a serially connected rectifier and current amplifier. The output of the current amplifier is also connected through a low pass filter to an output terminal. The high frequency signal is fed to the base of one of the above transistors, while the base of the other transistor is connected to a reference voltage.

When it is desired to have the differential amplifier provide push-pull rectification, two rectifiers are connected to the current amplifier in the feedback path from the collectors respectively, of the differential amplifier transistors.

An improved circuit is shown for push-pull rectification in the negative feedback arm with symmetrical operation of the differential amplifier.

13 Claims, 3 Drawing Figures

CIRCUIT FOR DEMODULATING AN AMPLITUDE MODULATED SIGNAL

BACKGROUND OF THE INVENTION

Classical demodulation of an amplitude-modulated high frequency signal (HF signal) has been effected by the principle of envelope curve rectification with the aid of a simple diode or by the same principle with the aid of a circuit which contains at least one such diode or an equivalent combination of a plurality of elements having a non-linear current-voltage characteristic. If such a demodulator is to be designed as an integrated circuit, the requirement of as large as possible a linearity range will be extended to that of effecting a wide linearity range with the lowest possible external outlay.

SUMMARY OF THE INVENTION

It is an object of the present invention to provide a novel integral circuit arrangement for a demodulator which possesses a large linear operative range for the low frequency (LF signal) and an integrable circuit, which requires the least possible external circuit outlay. To achieve this object, it is proposed in accordance with the invention that, at the input for a high frequency signal, there be arranged a differential amplifier with two transistors which are interconnected by their emitters with a constant current source located between said emitters and reference potential and with at least one ohmic collector resistor. A series connection of a rectifier and a current amplifier lies between the collector of the transistor with the collector resistor and the two emitters. As a result of this, the operative point of the transistors remains constant via a current negative feedback. The emitters lead to an output for a low frequency signal.

Another embodiment of the invention consists of having each of the two transistors of the differential amplifier provided with an ohmic collector resistor and both collectors are connected via a rectifier to the current amplifier.

A further advantageous embodiment provides a symmetrical operation of the differential amplifier. For this purpose, instead of an asymmetrical operation in which the high frequency signal to be demodulated is applied to the base of the one differential amplifier transistor, and the base of the other transistor is operated by a reference voltage source, here the differential amplifier is symmetrically operated in such a manner that the high frequency signal is located between the two bases of the differential amplifier transistors.

A still further advantageous embodiment of a circuit arrangement in accordance with the invention provides a subsequently connected low pass filter, as a result of which the high frequency waves still present in the low frequency signal are filtered out. The constant current source at the emitters of the two differential amplifier transistors advantageously consists of a transistor which is operated across its base by a stabilized voltage and whose base is also connected via a reference voltage diode to the reference potential.

The circuit arrangement in accordance with the invention realizes this aim in that the operative point of the differential amplifier which is operated by the high frequency signal is maintained constant. This is achieved in that the collector potential of the differential amplifier transistor or transistors is kept constant and in fact through the current negative feedback with the aid of the rectifier or rectifiers and the current amplifier. If there is to be an increase in the collector current, due to the control, then via the rectifier or rectifiers, the current amplifier is more strongly operated and receives more current from the constant current source so that the current flowing through the differential amplifiers remains constant. The emitter-base voltage across both the differential amplifier transistors remains constant. The emitter potential then exactly follows the peak amplitude of the high frequency signal which is to be demodulated. The linearity distortions are thus kept very low.

BRIEF DESCRIPTION OF THE DRAWINGS

The invention will be explained in detail, making reference to three exemplary embodiments which are illustrated in the drawing, in which.

DESCRIPTION OF THE PREFERRED EMBODIMENTS

Figure 1:
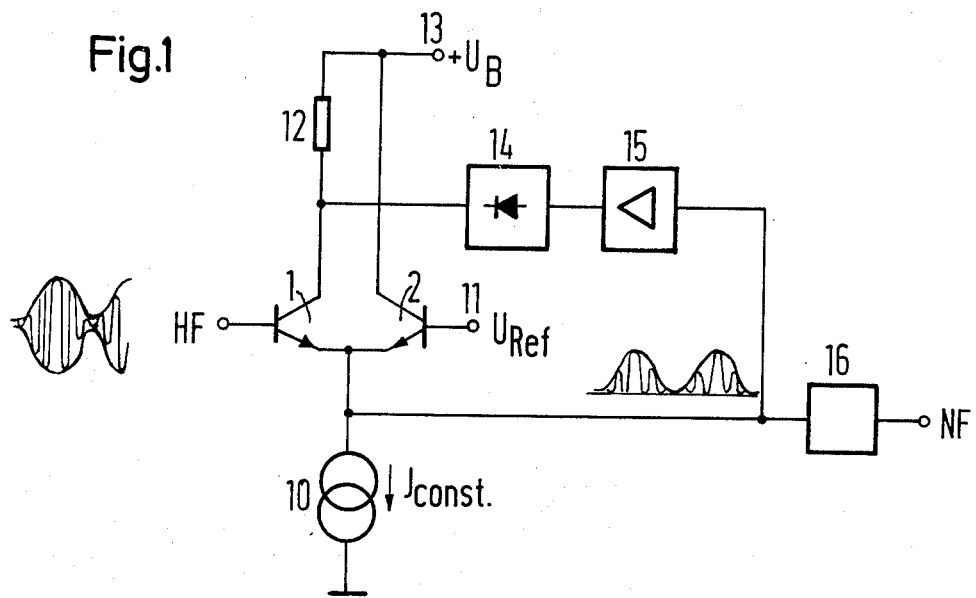
FIGS. 1 and 2 show circuit arrangements of two fundamental embodiments.

In FIG. 1, a differential amplifier comprises two transistors 1 and 2 of the npn-type which are interconnected by their emitters. The emitters lead via a constant current source 10 to the reference potential. The base of the transistor 1 is connected to an input for receiving a high frequency signal which is to be demodulated, and the base of the transistor 2 is connected to a terminal 11 for a reference voltage $U_{Ref}$. The collector of the transistor 2 is connected directly, and that of the transistor 1 via a resistor 12 to a terminal 13 for a supply potential $U_B$. The collector of the transistor 1 leads via the series connection of a rectifier 14 with a current amplifier 15 to the emitters of the two transistors 1 and 2. These two emitters are also connected via a low pass filter 16 to an output for a low frequency signal.

Figure 2:
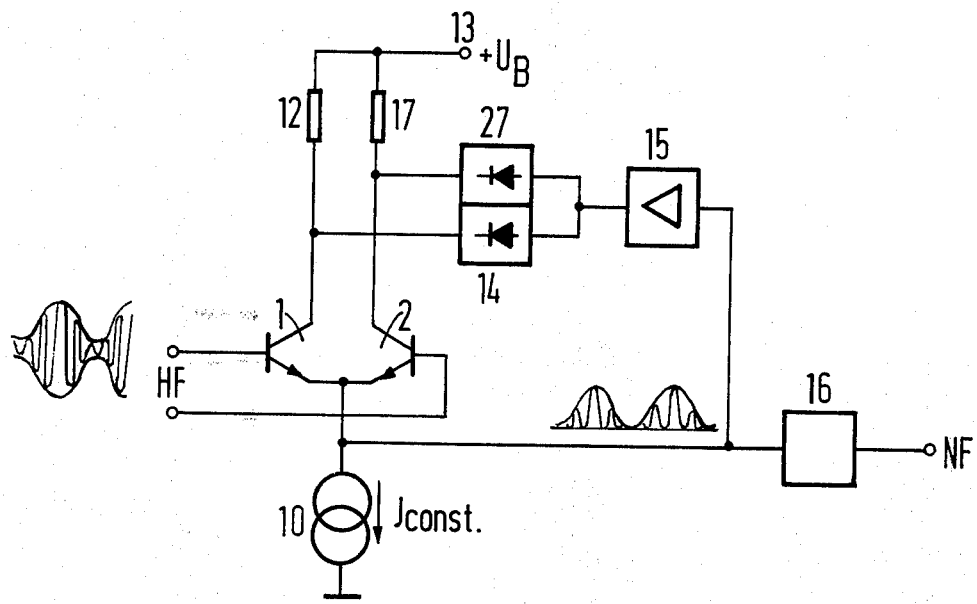

The embodiment shown in FIG. 2 also possesses a differential amplifier with the transistors 1 and 2, with the constant current source 10 and the collector resistor 12. Also provided are the negative feedback arm with the rectifier 14 and with the current amplifier 15, as well as the low pass filter 16. To distinguish this embodiment from the first embodiment, however, the differential amplifier is symmetrically operated in this embodiment. That is to say that the high frequency signal which is to be demodulated is applied between the bases of the two differential amplifier transistors 1 and 2. Furthermore, the negative feedback arm in this embodiment features push-pull rectification. That is to say, both collectors of the differential amplifier transistors 1 and 2 are each connected via a rectifying element 14, 27, respectively, to the current amplifier 15. The collector of the transistor 2 here is connected via a resistor 17 to the terminal 13 for the supply potential $U_B$.

Figure 3:
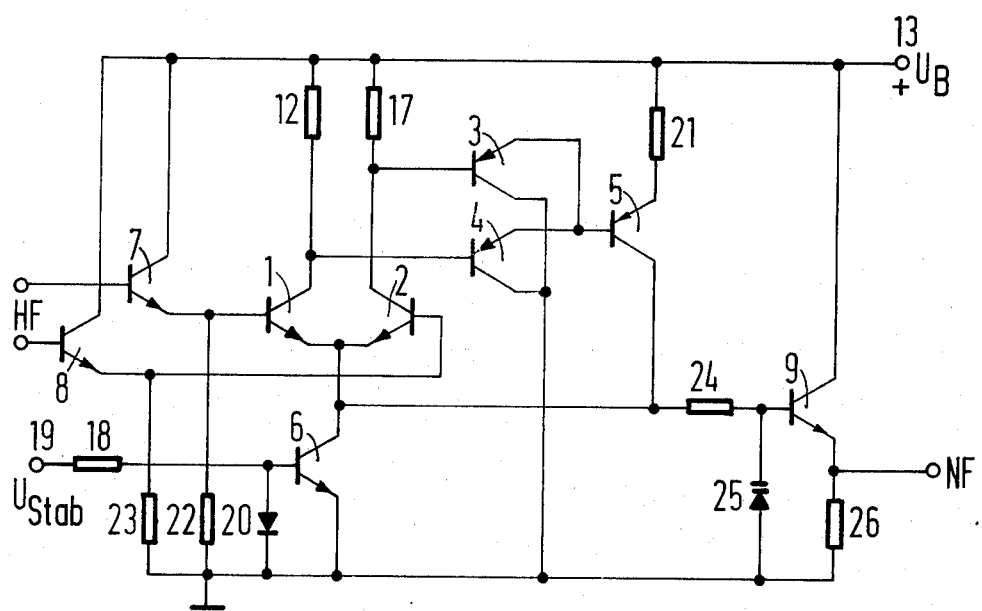
FIG. 3 shows the circuit arrangement of a more elaborate embodiment.

FIG. 3 contains a complete circuit design utilizing the principle of the embodiment in FIG. 2, with push-pull rectification in the negative feedback arm and with a symmetrical operation of the differential amplifier. Again, the two differential amplifier transistors 1 and 2 and the corresponding collector resistors 12 and 17 and the terminal 13 for the supply potential $U_B$ are provided. The constant current source 10 consists of a transistor 6 of the npn type whose collector is connected to the two emitters of the differential amplifier transistors 1 and 2 and whose emitter carries the reference potential. The base leads via a resistor 18 to the terminal 19 with a stabilized voltage $U_{Stab}$. Also, the base is connected via a reference voltage diode 20 to the reference potential. The rectifiers 14 and 27 of FIG. 2 are realized in FIG. 3 by two transistors 3 and 4 of the pnp type. For this purpose, the base of the transistor 3 is connected to the collector of the differential amplifier transistor 2 and the base of the transistor 4 is connected to the collector of the differential amplifier transistor 1. The collectors of the two transistors 3 and 4 are connected to the reference potential, and the emitters to the base of a transistor 5 which is of the pnp type. This transistor 5 forms the current amplifier 15 with an emitter resistor 21 which is located between its emitter and the supply potential $U_B$. Its collector is connected to the emitters of the two differential amplifier transistors 1 and 2.

The two differential amplifier transistors 1 and 2 are each operated via an impedance transformer. For this purpose, one input terminal is connected to the base of a transistor 7 of the npn type and the other input terminal is connected to the base of a transistor 8 of the npn type. The collectors of the two transistors 7 and 8 carry the supply potential $U_B$, and the emitters each are connected respectively via resistors 22, 23, to the reference potential. The emitter of the transistor 7 is connected to the base of the differential amplifier transistor 1, whereas the emitter of the transistor 8 is connected to the base of the differential amplifier transistor 2.

The low pass filter 16 of FIG. 2 is realized in FIG. 3 by a resistor 24 and a capacitance diode 25. The resistor 24 lies between the interconnection of the emitters of the two differential amplifier transistors 1 and 2 and the base of an output transistor 9 of the npn type whose collector is connected to the supply potential $U_B$. The capacitance diode 25 lies between the base of the output transistor 9 and the reference potential. The emitter leads to an output terminal for the low frequency signal and via a resistor 26 to the reference potential.

In the rest state, the emitter-base voltages of the two differential amplifier transistors 1 and 2 are equal. The collector resistors 12 and 17 are designed to be such that the threshold of the emitter-base diodes of the transistors 3 and 4 is reached and the transistor 5 receives a small part of the current from the transistor 6 - the constant current source. In dependence upon the positive and negative half waves of the envelope curve of the high frequency signal which is amplified via the differential amplifier, the two transistors 3 and 4 alternately conduct more or less greatly and thus rectify the high frequency signal. Via the transistor 5, these rectified envelope curve half waves act as a negative feedback current on the emitters of the differential amplifier transistors 1 and 2. When the common emitter current is to increase, through operation across its base by the two transistors 3 and 4, the transistor 5 receives a correspondingly larger quantity of current from the transistor 6. Consequently, the emitter-base voltages and the operative points of the two differential amplifier transistors 1 and 2 remain constant independently of the modulation. As a result, all the half waves of the high frequency signal appear in a positive direction across the two emitters through the push-pull rectification of the two transistors 3 and 4. With the aid of the capacitance diode 25 and of the resistor 24, the mean value of these half waves is formed so that the low frequency signal can be withdrawn via the end amplifier transistor 9.

A circuit arrangement, in accordance with the invention, is characterized by a large linearity range in the demodulation curve and represents a circuit concept which can easily be integrated. The invention is not, however, limited to the specific exemplary embodiments for the principle of maintaining constant the operative point of a differential amplifier via the current negative feedback for the purpose of demodulation can also be realized in a modified form.

We claim as our invention:

1. A circuit for demodulating an amplitude modulated high frequency signal comprising a common emitter differential amplifier having a rectified negative feedback path, said differential amplifier including a pair of transistors of the same polarity type whose collectors are arranged to be connected to a potential source, at least the collector of a first one of said transistors being connected through a resistor to said potential source, a reference potential, a constant current source, the emitters of said transistors being connected together and through said constant current source to said reference potential, a current amplifier, rectifying means connected between at least the collector of the first one of said transistors and one side of said current amplifier, the other side of said current amplifier being connected to said emitters to provide a rectified negative feedback, an output terminal, and a low pass filter connected between said emitters and said output terminal, and circuit means for supplying the high frequency signal to the bases of said transistors.

2. A circuit for demodulating an amplitude modulated high frequency signal comprising a common emitter differential amplifier having a rectified negative feedback path, said differential amplifier including a pair of transistors of the same polarity type whose collectors are arranged to be connected to a potential source, the collector of a first one of said transistors being connected through a resistor to said potential source, the collector of the second one of said transistors being connected directly to said potential source, the emitters of said transistors being connected together and to one side of a constant current source, the other side of said constant current source being connected to a reference potential, a current amplifier and a rectifier serially connected between the collector of said first one of said transistors and said emitters, an output terminal, a low pass filter connected between said emitters and said output terminal, a high frequency signal input terminal connected to the base of said first one of said transistors, and the base of the other one of said transistors being connected to said reference potential.

3. A circuit for demodulating an amplitude modulated high frequency signal comprising a common emitter differential amplifier having a rectified negative feedback path, said differential amplifier including a pair of transistors of the same polarity type whose collectors are arranged to be connected to a potential source, the collectors of each of said transistors being connected through an associated resistor to a potential source, the emitters of said transistors being connected together, a constant current source, said emitters being connected to said reference potential through said constant current source, circuit means connecting the high frequency signal across the bases of said transistors, a current amplifier, a pair of rectifying means, one of said rectifying means being connected between the collector of one of said transistors and the input of said current amplifier, said other one of said rectifying means being connected between the collector of the other one of said transistors and said input of said current amplifier, the output of said current amplifier being connected to said emitters, a low pass filter, and an output terminal, said low pass filter being connected between said emitters and said output terminal, a pair of high frequency signal input terminals connected respectively to the bases of said transistors.

4. A circuit arrangement for the demodulation of an amplitude-modulated signal employing envelope-curve rectification, comprising a high frequency input terminal, a low frequency output terminal, a terminal for connection with a potential source, a reference potential, a reference voltage source, a differential amplifier having two transistors of the same polarity type, the base of a first one of said transistors being connected to said input terminal, the emitters of said transistors being connected together, a constant current source, said emitters being connected through said constant current source to said reference potential, a collector resistor connected between the collector of said first one of said transistors and said potential source terminal, a rectifier, and a current amplifier serially connected between the collector of said first one of said transistors and said two emitters, whereby via a current negative feedback, the operative point of the said transistors remains constant, and whereby said emitters provide an output for a low frequency signal.

5. A circuit arrangement as set forth in claim 4, in which each of said two transistors of the differential amplifier has a collector resistor, and both collectors are connected via said rectifier to said current amplifier.

6. A circuit arrangement as set forth in claim 4, in which said reference voltage source is connected between the base of said second transistor and said reference potential.

7. A circuit arrangement as set forth in claim 4, in which said input is connected across the bases of said two transistors of said differential amplifier, whereby the high frequency signal lies between the two bases.

8. A circuit arrangement as set forth in claim 4, in which a low pass filter is connected between the interconnection of the emitters of said transistors of said differential amplifier and the output.

9. A circuit arrangement as set forth in claim 5, in which the rectifiers are each provided by a transistor, and wherein the collector of said second differential amplifier transistor is connected to the base of a third transistor and the collector of the first differential amplifier transistor is connected to the base of a fourth transistor, the collectors of said third and fourth transistors carrying a reference potential, and the emitters being connected to the base of a fifth transistor which forms a current amplifier being connected by its emitter via a resistor to a supply potential, the collector of said fifth transistor being connected to the emitters of said differential amplifier transistors, said first and second transistors being of the same conductivity type and said third, fourth and fifth transistors being of the opposite conductivity type.

10. A circuit arrangement as set forth in claim 9, in which the constant current source consists of a sixth transistor of the same conductivity type as said differential amplifier transistors, the collector of said sixth transistor being connected to the two emitters of said differential amplifier transistors, said emitters being connected to a reference potential, and the base of said sixth transistor being connected to a terminal for receiving a stabilized voltage.

11. A circuit arrangement as set forth in claim 10, in which the base of said sixth transistor is connected via a reference voltage diode to the reference potential.

12. A circuit arrangement as set forth in claim 11, in which between the input terminals and the bases of the differential amplifier transistors there is located in each case an impedance transformer which consists of a seventh and an eighth transistor of the same conductivity type as said differential amplifier transistors, one input terminal being connected to the base of said seventh transistor and the other input terminal being connected to the base of said eighth transistor, the collectors of said seventh and eighth transistors being connected to a potential source, and the emitters of said seventh and eighth transistors being connected respectively to the two bases of said differential amplifier transistors, and also being connected through a resistor to the reference potential.

13. A circuit arrangement as set forth in claim 12, in which the emitters of said differential amplifier transistors are connected via a resistor to the base of a ninth transistor of the same conductivity type as the differential amplifier transistors, the collector of said ninth transistor being connected to a potential source, the base of said ninth transistor being connected through a capacitance diode to the reference potential and whose emitter is connected to the reference potential through a resistor as well as to an output terminal for the low frequency signal.

* * * * *